United States Patent [19]
Williams

[11] Patent Number: 5,629,639
[45] Date of Patent: May 13, 1997

[54] CORRELATION PEAK DETECTOR

[75] Inventor: Claude M. Williams, Colorado Springs, Colo.

[73] Assignee: Omnipoint Corporation, Colorado Springs, Colo.

[21] Appl. No.: 476,206

[22] Filed: Jun. 7, 1995

[51] Int. Cl.$^6$ .......................... G01R 19/00; H03K 5/153
[52] U.S. Cl. .................................. 327/60; 327/58
[58] Field of Search .................... 327/58–62, 72, 327/91, 94, 33

[56] References Cited

U.S. PATENT DOCUMENTS

| | | | |
|---|---|---|---|
| 3,934,203 | 1/1976 | Schiff | 325/65 |
| 4,164,628 | 8/1979 | Ward et al. | 179/15 BA |
| 4,291,410 | 9/1981 | Caples | 375/1 |
| 4,327,438 | 4/1982 | Baier et al. | 375/1 |
| 4,355,399 | 10/1982 | Timor | 375/1 |
| 4,550,414 | 10/1985 | Guinon et al. | 375/1 |
| 4,561,089 | 12/1985 | Rouse et al. | 370/18 |
| 4,563,774 | 1/1986 | Gloge et al. | 455/607 |
| 4,587,662 | 5/1986 | Langwellpott | 375/1 |
| 4,601,047 | 7/1986 | Horwitz et al. | 375/2.2 |
| 4,621,365 | 11/1986 | Chiu | 375/1 |
| 4,637,003 | 1/1987 | Yokogawa | 327/58 |
| 4,653,069 | 3/1987 | Roeder | 380/31 |
| 4,691,326 | 9/1987 | Tauchiya | 375/1 |
| 4,774,715 | 9/1988 | Messenger | 375/1 |
| 4,813,057 | 3/1989 | Fullerton | 375/37 |
| 4,860,307 | 8/1989 | Nakayama | 375/1 |
| 4,965,759 | 10/1990 | Uchida et al. | 364/604 |
| 5,029,184 | 7/1991 | Andren et al. | 375/1 |
| 5,081,642 | 1/1992 | O'Clock et al. | 375/1 |
| 5,081,643 | 1/1992 | Schilling | 375/1 |
| 5,132,986 | 7/1992 | Endo et al. | 375/1 |
| 5,177,766 | 1/1993 | Holland et al. | 375/1 |
| 5,299,227 | 3/1994 | Rose | 375/1 |
| 5,353,303 | 10/1994 | Walthall | 375/1 |

OTHER PUBLICATIONS

Freret, Payne et al., *Applications of Spread–Spectrum Radio to Wireless Terminal Communications*, Proceedings of the IEEE, 1980, pp. 69.7.1–69.7.4.

Dixon, R., *Spread Spectrum Systems with Commercial Applications* (J. Wiley & Sons, 3d ed. 1994).

Dixon, Robert C., *Spread Spectrum Systems*, (J. Wiley & Sons, 2d ed. 1984).

*Primary Examiner*—Toan Tran
*Attorney, Agent, or Firm*—Lyon & Lyon LLP

[57] ABSTRACT

A correlation peak detector including an envelope detector, a peak-holder, a peak scaler, and a comparator detects the envelope of a correlator output signal, derives a peak threshold signal from the peak signal level produced by the correlator output signal, and compares the envelope of the correlator output signal to the peak threshold signal to produce a correlation peak detector output signal which indicates detection of a correlation peak. A minimum threshold signal is generated and provided to the comparator to inhibit detection of false peaks or noise. The comparator produces a correlation peak detector output signal which indicates occurrence of a correlation peak by producing a pulse whenever the magnitude of the envelope of the correlator output signal exceeds the sum of the magnitude of the peak threshold signal and the magnitude of the minimum threshold signal. Pulses in the correlation peak detector output signal may be used to synchronize receiver timing signals with a received signal. Simultaneous detection of peaks in a plurality of correlator output signals is accomplished by individually comparing each correlator output signal's envelope with the peak threshold signal to produce a plurality of correlation peak detector output signals, and combining the correlation peak detector output signals to produce a combined correlation peak detector output signal having a pulse whenever a correlation peak is detected in any of the plurality of correlator output signals.

9 Claims, 6 Drawing Sheets

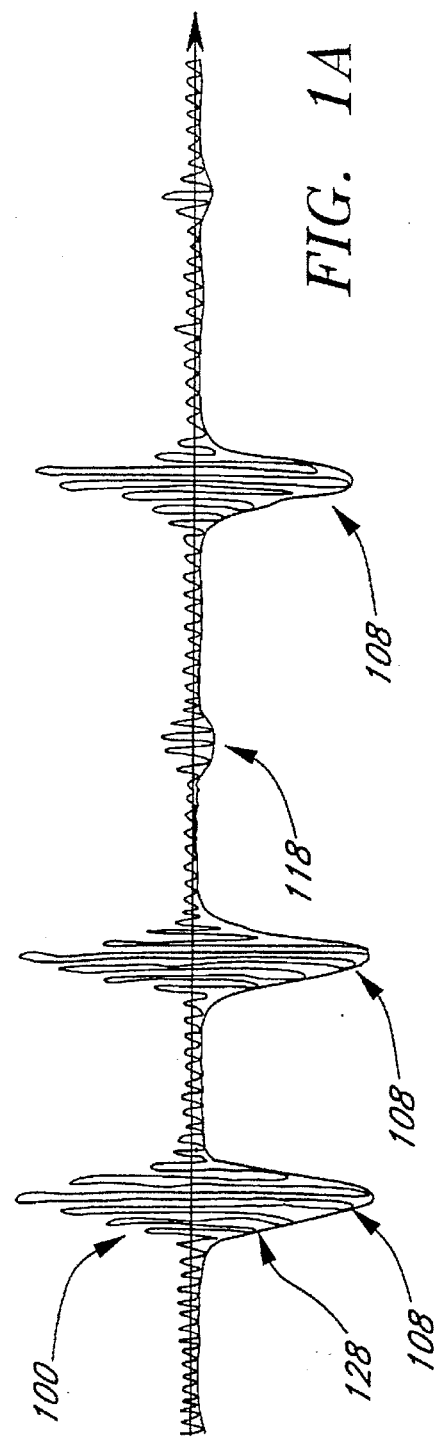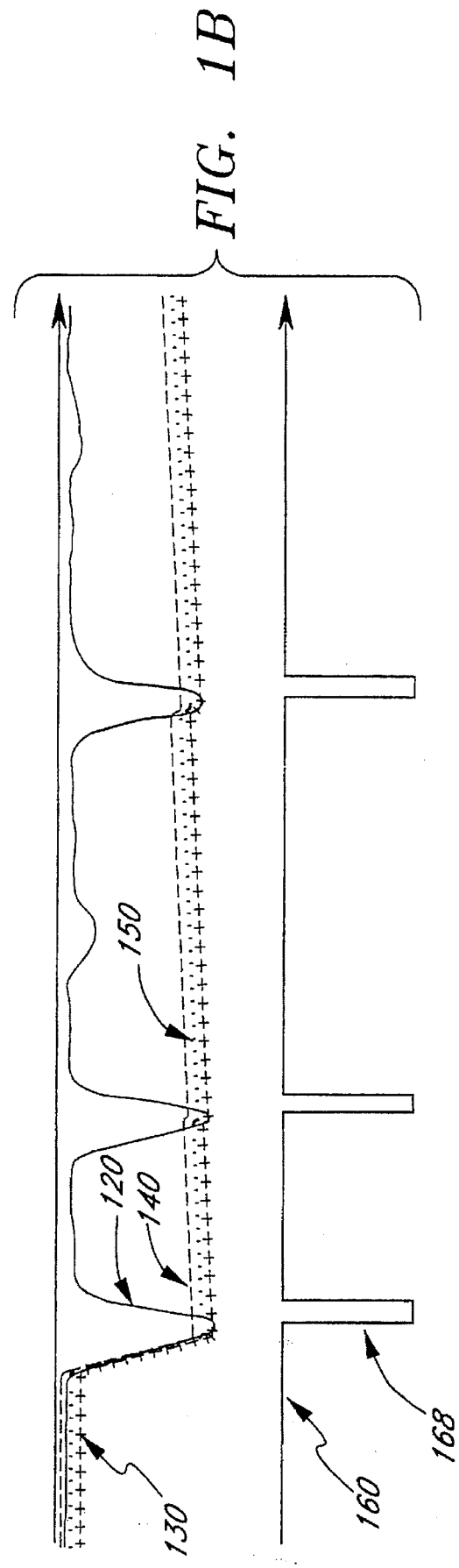

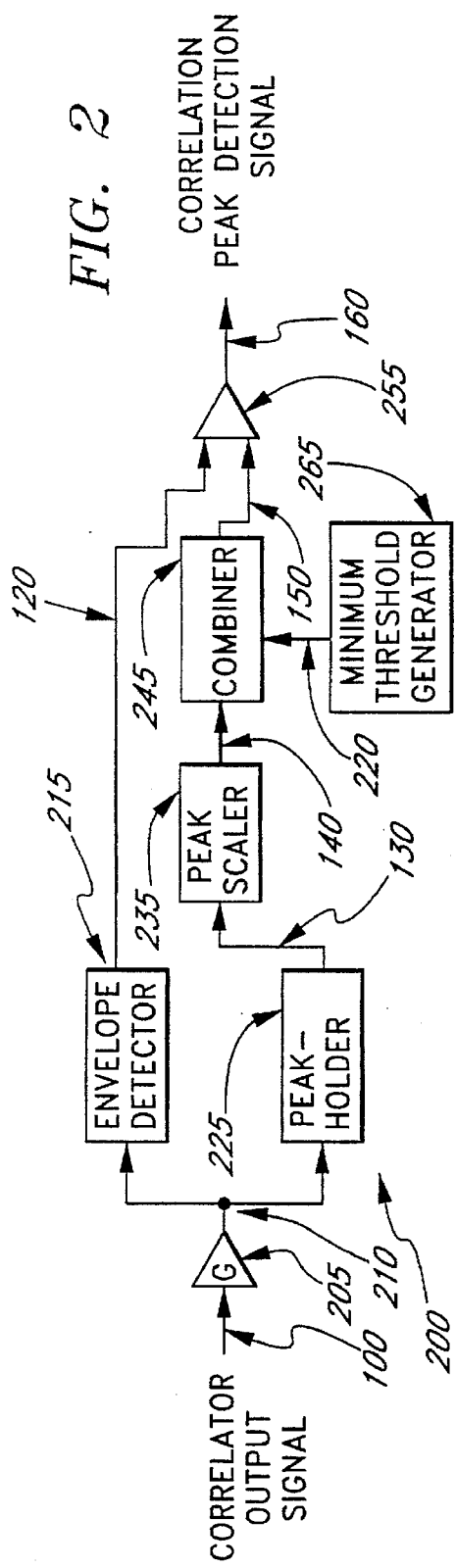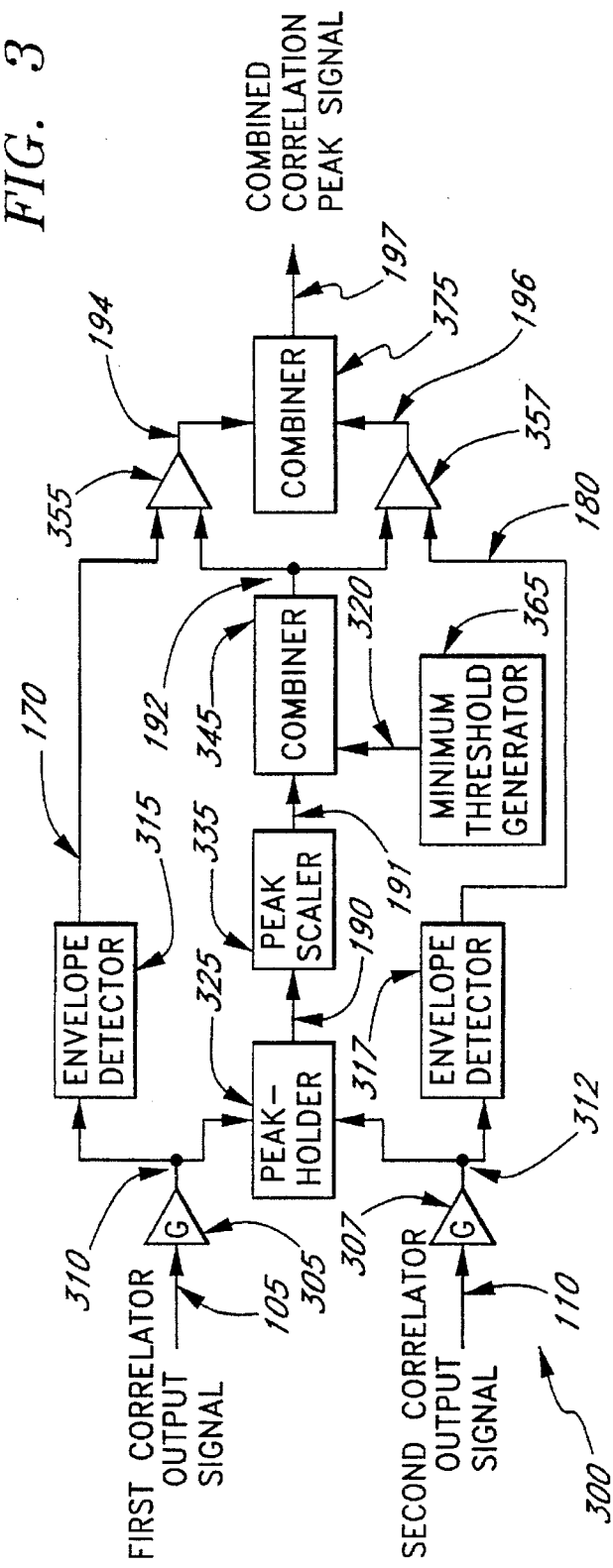

CORRELATION PEAK DETECTOR

BACKGROUND OF THE INVENTION

1) Field of the Invention

This invention pertains to the field of communications and, more particularly, to a method and apparatus for detecting correlation peaks.

2) Background of the Related Art

One problem that commonly arises in communication systems is achieving synchronization between a receiver and a transmitter. While a synchronization signal may be employed, it is not always practical to provide a separate synchronization signal from the transmitter to the receiver when the receiver is located remotely from the transmitter. Synchronization can be especially difficult in mobile communication systems where communications occur sporadically, producing timing drift between transmitter and receiver circuits and, consequently, requiring frequent resynchronization.

A well known and popular synchronization technique involves the use of a predetermined correlation sequence. In such a technique, a transmitter transmits a predetermined correlation sequence at a regular or predetermined interval—e.g. at the start of each transmission, during the first transmission of a communication session, or according to some other convenient arrangement. A communication receiver likewise is provided with the predetermined correlation sequence. The receiver is provided with a correlator which compares the received signal with the predetermined correlation sequence to determine when the predetermined correlation sequence has been received.

Whenever the correlator matches the received signal to the predetermined correlation sequence, it produces a signal indicating that a correlation event has occurred. The timing of the correlation event may be used by the communication receiver to synchronize an internal clock or timer with the received signal. Synchronization in this manner by means of a predetermined correlation sequence is widely employed in digital communication systems.

Correlators also may be used in communication systems employing spread spectrum communication techniques. One well known spread spectrum communication technique is direct sequence spreading. In a direct sequence spread spectrum communication system, a digital symbol is encoded with a predetermined spreading code sequence prior to transmission over a communication channel. By using a spreading code sequence operating at a rate that is a multiple of the digital symbol rate, the resulting spread spectrum signal has a chip rate which is several times the digital symbol rate. A spread spectrum receiver may be provided with a spreading code sequence correlator which despreads the received spread spectrum signal using the predetermined spreading code sequence in order to recover the original digital symbol.

In a spread spectrum system, during each symbol period the transmitter may transmit one of several spreading code sequences each corresponding to a different symbol. In such a case, the receiver must simultaneously search for a correlation event corresponding to each symbol. This may be accomplished by the use of several correlators, each matched to a different unique spreading code sequence.

A spreading code sequence correlator may be used to provide timing signals for a spread spectrum receiver. The correlator may continuously compare the received signal with the predetermined spreading code sequence to determine when a correlation event occurs. As the correlator receives a signal containing the predetermined spreading code sequence, the correlator output signal steadily builds to produce a correlation peak at the end of the predetermined spreading code sequence signifying a correlation event.

The timing of the correlation peak may be used by the receiver for synchronization. For example, the receiver may have apriori knowledge of the symbol period, T, required for each transmission of a spreading code sequence. T is also the expected time interval between successive correlation events. Thus, the receiver may produce a clock signal operating at the received signal's symbol rate. However, the clock signal must still somehow be time or phase synchronized with the timing of the received symbols and this may be accomplished by means of a correlator as described above.

However, the above synchronization techniques face certain obstacles, particularly when the communication channel is subject to noise, interference, fading, and other losses. The correlator may falsely signal a correlation event in response to noise or random bit patterns. Also, true correlation events may be masked whenever noise-induced chip errors reduce the level of the correlation peak. Moreover, multipath propagation conditions may result in the occurrence of several localized correlation "peaks" instead of a steadily increasing buildup to a single correlation peak at the end of the correlation sequence. These problems are especially prevalent during the initiation of a communication session when the receiver has no knowledge of the time when a correlation event should be expected.

Accordingly, it would be advantageous to provide an improved correlation peak detector incorporating a peak threshold signal which dynamically adjusts to match the level of a received signal. It would further be advantageous to provide a correlation peak detector which mitigates the effects of noise or spurious inputs on detection of correlation peaks. It would be further advantageous to provide a correlation peak detector output signal which may be used to synchronize receiver timing circuits with a received signal.

SUMMARY OF THE INVENTION

The present invention in one aspect relates to a method and apparatus for detecting a correlation peak in a correlator output signal.

In one embodiment, a correlation peak detector comprises an envelope detector and a fast attack, slow decay peak-holder. A correlator output signal is generated upon receipt of a signal. The peak-holder detects and holds the peak signal level from the correlator output signal to produce a peak detection signal. The peak detection signal is scaled down by a factor to produce a peak threshold signal. The envelope of the correlator output signal is compared to the peak threshold signal to produce a correlation peak detector output signal which indicates occurrence of correlation events. As the correlator output signal builds to a correlation peak, the peak threshold signal is thereby adjusted or "ratcheted" upward such that only successively higher correlator output signal levels trigger detection of a correlator peak.

In another aspect of the present invention, a correlation peak detector uses a minimum threshold signal to inhibit spurious detection of correlation peaks in response to interference, crosstalk, or noise.

In another aspect of the present invention, a correlation peak detector output signal indicates detection of a correlation peak by producing a pulse whenever the magnitude of the envelope of a correlator output signal exceeds the sum of the magnitude of a peak threshold signal and the magnitude of a minimum threshold signal.

In yet another aspect of the present invention, a spread spectrum receiver uses a correlation peak detector output signal to synchronize a receiver timing signal with a pulse in a received signal. The correlation peak detector generates an output pulse in response to detection of an apparent correlation peak in a correlator output signal. At the same time, the correlation peak detector "ratchets" up an internal threshold such that only a successively larger peak will trigger another output pulse. Whenever the correlation peak detector generates an output pulse within a predetermined timing window T, a receiver timing signal is synchronized with the timing of the pulse. If a subsequent pulse is produced during the timing window, signifying detection of a larger peak, then the timing signal is resynchronized with the latter pulse. If, no subsequent larger peaks are detected before the end of the timing window, then the last apparent correlation peak is assumed correct.

In still another aspect of the present invention, the envelopes of multiple correlator output signals are each individually compared to a single peak threshold signal to produce multiple correlation peak detector output signals, each of which provides indication of a correlation peak in a correlator output signal. A peak threshold signal is derived from the maximum peak signal level produced by any of the correlator output signals.

BRIEF DESCRIPTION OF THE DRAWINGS

FIGS. 1A–1B are graphs of a correlator output signal, an envelope signal, and other signals and features of interest associated with a preferred correlation peak detector.

FIG. 2 is a block diagram of a first embodiment of a correlation peak detector in accordance with one or more aspects of the present invention.

FIG. 3 is a block diagram of a second embodiment of a correlation peak detector in accordance with one or more aspects of the present invention.

DESCRIPTION OF THE PREFERRED EMBODIMENT

Figure 4:
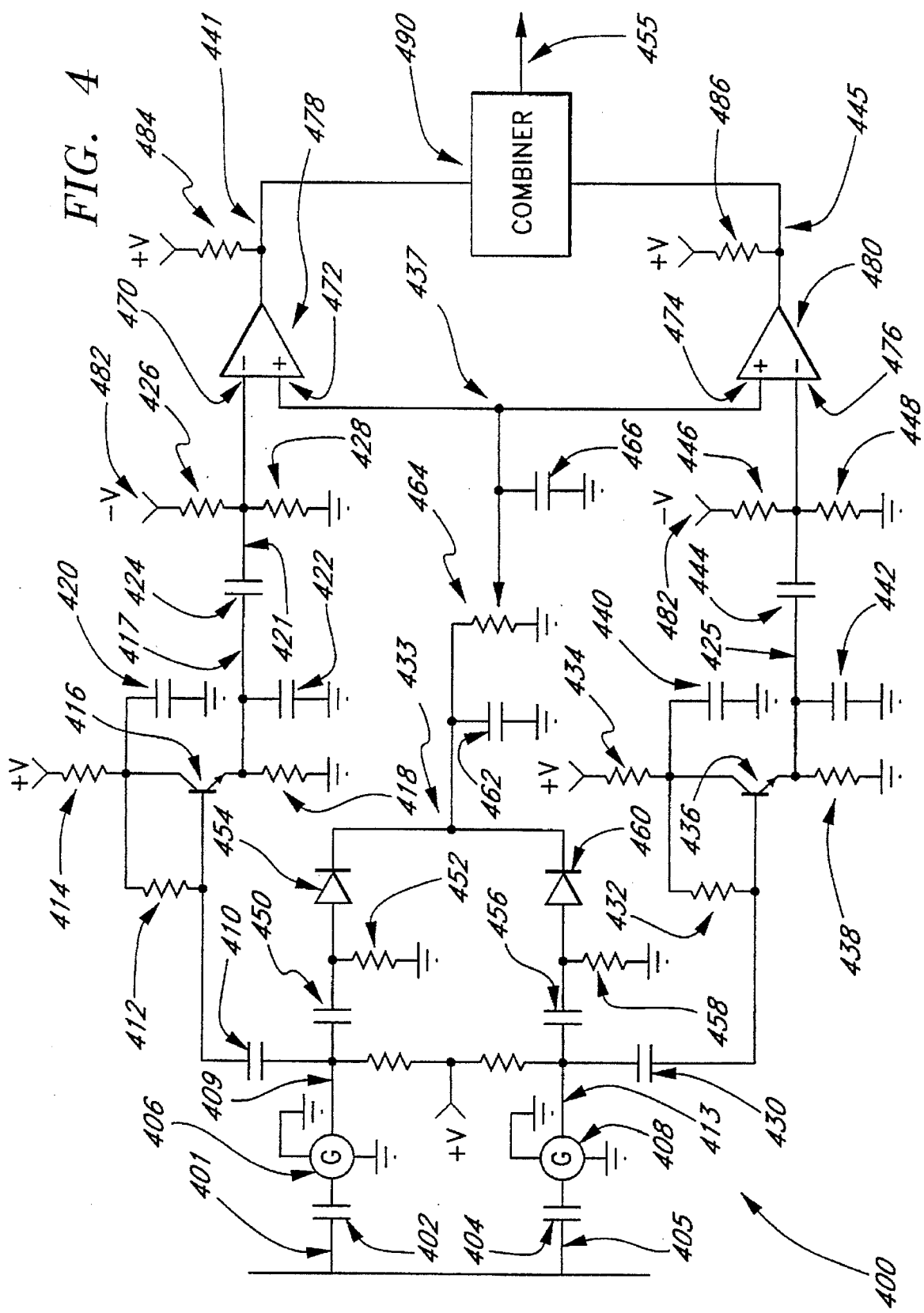
FIG. 4 is a schematic diagram of one embodiment of a correlation peak detector circuit.

FIG. 1A is a graph showing an exemplary correlator output signal 100 which may be received by a correlation peak detector according to one or more aspects of the present invention. As shown in FIG. 1A, the correlator output signal 100 comprises a high frequency waveform whose amplitude is modulated by a series of correlation peaks 108 having a width 128. The correlator produces correlation peaks 108 whenever a predetermined correlation sequence is detected.

Conveniently, correlation may be accomplished in a spread spectrum system through the use of a reciprocal surface acoustic wave (SAW) correlator as disclosed in U.S. Pat. No. 5,355,389 entitled "Reciprocal Mode SAW Correlator Method and Apparatus," by George D. O'Clock and Jeffrey S. Vanderpool which is incorporated hereby by reference as if fully set forth herein.

However, the correlation peak detector may operate with correlator output signals from a variety of other correlators known in the art. The correlator output signal 100 may contain a series of "false peaks" 118. False peaks are small local signal peaks which are not created by a correlation match in the correlator producing the correlator output signal 100, but which may result from crosstalk between one or more other signals containing orthogonal correlation sequences.

FIG. 2 is a block diagram of a first embodiment of a correlation peak detector 200 which may be used to detect correlation peaks 108 in the correlator output signal 100. In a preferred embodiment, the correlator output signal 100 is coupled to a high frequency amplifier stage 205 which generates an amplified correlator output signal 210. Alternatively, amplification of the correlator output signal 100 may accomplished or by other gain stages (not shown) preceding the correlation peak detector such that the high frequency amplifier stage 205 is not required.

The amplified correlator output signal 210 is provided to an envelope detector 215 and a peak-holder 225. The envelope detector and peak-holder 225 may collectively detect either positive or negative peaks in the amplified correlator output signal 210. The envelope detector 215 rectifies the amplified correlator output signal 210, removing the high frequency components so as to produce a correlator output envelope signal 120 such as shown in FIG. 1B. The correlator output envelope signal 120 is input to a comparator 255.

The peak-holder 225 detects and holds the peak signal level of the amplified correlator output signal 210 and produces a peak detection signal 130 such as shown in the exemplary waveform diagram of FIG. 1B. The peak-holder 225 preferably has a decay time such that the peak detection signal 130 decays only slightly over the time interval, T, between expected consecutively spaced correlation peaks.

The peak detection signal 130 is coupled to a peak scaler 235 which scales down the level of peak detection signal 130 by a ratio which is less than or equal to one, resulting in a peak threshold signal 140. The peak scaler 235 ensures that when a true correlation peak occurs, the magnitude of the correlation envelope signal 120 will exceed threshold signal 140 by a sufficient amount to toggle the comparator 255.

In a preferred embodiment, a minimum threshold signal 220 is generated by a minimum threshold generator 265. The minimum threshold signal 220 sets a minimum peak threshold for detection of a correlation peak to inhibit the comparator 255 from toggling on noise or false peaks 118. The minimum peak threshold is adjusted to produce an acceptable "false alarm" rate. The peak threshold signal 140 is coupled to a combiner 245 which combines the peak threshold signal 140 with the minimum threshold signal 220 to produce a combined signal 150 as shown in FIG. 1B. The combined signal 150 is coupled to the comparator 255. Comparator 255 compares the correlation envelope signal 120 with the peak threshold signal 140 and the minimum threshold signal 220 so as to produce a correlation peak detector output signal 160 such as shown in FIG. 1B.

The comparator 255 preferably produces a correlation peak detector output signal 160 having pulses 168 whenever the magnitude of the correlator output envelope signal 120 exceeds the sum of the magnitude of the peak threshold signal 140 and the magnitude of the minimum threshold signal 220. Thus, the peak-holder 225 provides a peak detection threshold which is continuously "ratcheted" upward such that only successively higher levels in the correlation envelope signal 120 during the time interval, T, will trigger generation of output pulses 168 by the correlation peak detector 200.

The pulses 168 may be utilized by a communication receiver for establishing timing synchronization as more fully discussed below with respect to FIG. 6. Although the FIG. 2 embodiment operates by determining negative peaks and a negative envelope, and produces low-going pulses 168, equivalent embodiments are possible which detect positive peaks, a positive envelope, and which produce high-going pulses.

Other variations or modifications are also possible and are understood to fall within the scope and spirit of the invention. For example, the minimum threshold signal 220 may be combined with the correlator output envelope signal 120, instead of the peak threshold signal 140, before being applied to the comparator 255, without changing the functionality of the correlation peak detector.

FIG. 3 is a block diagram of another embodiment of a correlation peak detector 300 which may be used to detect correlation peaks occurring in either of two correlator output signals. In the FIG. 3 embodiment, the envelopes of two correlator output signals are each individually compared to a peak threshold signal generated from the maximum peak signal level produced by either of the correlator output signals. The correlation peak detector 300 produces a combined correlation peak detector output signal indicating whether the magnitude of the envelope of either correlator output signal exceeds the magnitude of the peak threshold signal by a preset margin—e.g., by at least the magnitude of a minimum threshold signal.

The operation of correlation peak detector 300 is similar to that described above with respect to the correlation peak detector 200, with the following relevant distinctions. In a preferred embodiment of the FIG. 3 correlation peak detector, a first correlator output signal 105 is coupled to a high frequency amplifier stage 305 which generates a first amplified correlator output signal 310. Likewise, a second correlator output signal 110 is coupled to a second high frequency amplifier 307 which generates a second amplified correlator output signal 312.

In a preferred embodiment, the first amplified correlator output signal 310 is provided to a first envelope detector 315 and a peak-holder 325. The first envelope detector 315 rectifies the amplified correlator output signal 310, removing the high frequency components so as to produce a first correlator output envelope signal 170.

Likewise, the second amplified correlator output signal 312 is provided to a second envelope detector 317 and the peak-holder 325. The second envelope detector 317 rectifies the amplified correlator output signal 312, removing the high frequency components so as to produce a second correlator output envelope signal 180.

The peak-holder 325 tracks and holds the peak signal level of the amplified correlator output signals 310 and/or 312, thereby generating a peak detection signal 190. The peak-holder 325 preferably has a decay time such that the peak detection signal 190 decays only slightly during the time interval, T, between expected consecutive correlation peaks. The peak detection signal 190 is provided to a peak scaler 335 which scales the level of the peak detection signal by a ratio which is less than or equal to one to generate a peak threshold signal 191.

In a preferred embodiment, the peak threshold signal 191 is coupled to a combiner 345 which combines the peak threshold signal 191 with a minimum threshold signal 320, provided by a minimum threshold generator 365, to generate a combined signal 192. The minimum threshold signal 320 sets a minimum peak threshold for detection of a correlation peak to inhibit the first and second comparators 355 and 357 from toggling on noise or false peaks. The combined signal 192 is coupled to first and second comparators 355 and 357.

Comparator 355 compares the first correlator output envelope signal 170 with the combined signal 192 comprising the peak threshold signal 191 and the minimum threshold signal 320, to generate a first correlation peak detector output signal 194.

In a preferred embodiment, the comparator 355 generates a pulse in the first correlation peak detector output signal 194 in response to the magnitude of the first correlator output envelope signal 170 exceeding the sum of the magnitude of the peak threshold signal 191 and the magnitude of threshold signal 320.

Likewise, the comparator 357 compares the second correlation envelope signal 180 with the peak threshold signal 191 resulting in a second correlation peak detection signal 196.

In a preferred embodiment, the comparator 357 generates a pulse in the second correlation peak detector output signal 196 in response to the magnitude of the second correlator output envelope signal 180 exceeding the sum of the magnitude of the peak threshold signal 191 and the magnitude of the minimum threshold signal 320.

Thus, the peak-holder 325 provides a peak detection threshold which is continuously "ratcheted" upward such that only successively higher levels in the correlation envelope signal 120 during the time interval, T, will trigger generation of output pulses by the correlation peak detector 300.

In a preferred embodiment, the first and second correlation peak detector output signals 194 and 196 are coupled to combiner 375 (which may be an AND gate) resulting in a combined correlation peak detector output signal 197 exhibiting a pulse in response to an apparent correlation event occurring in either correlator output signal. The combined correlation peak detector output signal 197 may be used to establish timing synchronization in a receiver as more fully discussed below with respect to FIG. 6.

Many other variations or modifications are possible. For example, the minimum threshold combiner may be placed after the envelope detector to combine the minimum threshold signal with the correlator output envelope signal, instead of the peak threshold signal, before it is applied to the comparator. To those skilled in the art, in will be apparent that the same result obtains. Also, although the correlation peak detector 300 of FIG. 3 is described with respect to two correlator output signals, it is possible to increase the number of envelope detectors and comparators used to detect correlation peaks in M correlator output signals. Such variations and modifications will be understood by those skilled in the art to come within the spirit and scope of the claims of the present invention.

FIG. 4 is a schematic circuit diagram of a first preferred embodiment of a correlation peak detector circuit 400 which may be used to detect correlation peaks occurring in either of two (M=2) correlator output signals according to one or more aspects of the present invention. In the correlation peak detector circuit 400, the envelopes of two correlator output signals are each individually compared to a single peak threshold signal derived from the maximum peak signal level produced by either of the correlator output signals. A combined correlation peak detector output signal indicates whether the magnitude of the envelope of either correlator output signal exceeds the magnitude of the peak threshold signal by a preset margin, e.g. by at least the magnitude of a minimum threshold signal.

A first correlator output signal 401 is coupled via a first coupling capacitor 402 to a first high frequency amplifier 406. In a preferred embodiment the high frequency amplifier 406 comprises a monolithic microwave integrated circuit (MMIC) amplifier which may be a Mini-Circuits MAR-6SM. The high frequency amplifier 406 provides a first amplified correlator output signal 409 via coupling capacitor 410 to a first envelope detector comprising resistors 412, 414 and 418; transistor 416; bypass capacitor 420; and rectification capacitor 422. The values of resistor 418 and capacitor 422 are selected to provide an appropriate RC decay time constant for following the envelope of the first amplified correlator output signal 409. The first envelope detector generates a first correlator output envelope signal 417.

The first correlator output envelope signal 417 is coupled via a coupling capacitor 424 to a first minimum threshold voltage generated from a negative voltage supply 482 and resistors 426 and 428. The first correlator output envelope signal 417 is combined with a minimum threshold voltage and provided to a negative input 470 of a first comparator 478.

Likewise, a second correlator output signal 405 is coupled via a second coupling capacitor 404 to a second high frequency amplifier 408. In a preferred embodiment the high frequency amplifier 408 comprises a monolithic microwave integrated circuit (MMIC) amplifier which may be a Mini-Circuits MAR-6SM. The high frequency amplifier 408 provides a second amplified correlator output signal 413 via coupling capacitor 430 to a second envelope detection circuit comprising resistors 432, 434 and 438; transistor 436; bypass capacitor 440; and rectification capacitor 442. The values of resistor 438 and capacitor 442 are selected to provide an appropriate RC decay time constant for following the envelope of the second amplified correlator output signal. The second envelope detector generates a second correlator output envelope signal 425.

The second correlator output envelope signal 425 is coupled via a coupling capacitor 444 to a second minimum threshold voltage generated from the negative voltage supply 482 and resistors 446 and 448. The second correlator output envelope signal 425 is combined with a minimum threshold voltage and coupled to a negative input 476 of a second comparator 480.

The high frequency amplifiers 406 and 408 also provide the first and second amplified correlator output signals 409 and 413 to a peak-holder comprising capacitors 450 and 456, inductors 452 and 458, Schottky diodes 454 and 460, peak-hold capacitor 462, and potentiometer 464. The peak-holder detects peaks in the first and/or second correlator output signals 401 and 405 and provides a peak detection signal 433. The values of peak-hold capacitor 462 and potentiometer 464 are selected to produce a sufficiently long RC decay time constant such that the voltage on capacitor 462 decays only slightly over a symbol period T between expected consecutive correlation peaks.

The wiper of potentiometer 464 establishes a voltage divider for scaling the peak detection signal 433 to provide a peak threshold signal 437 to the positive inputs 472 and 474 of first and second comparators 478 and 480 respectively. Comparator 478 compares the first correlator output envelope signal and first minimum threshold voltage with the peak threshold signal 437 to generate a first correlation peak detector output signal 441. In a preferred embodiment, comparator 478 incorporates an open collector output circuit which is pulled up to a positive voltage through resistor 484.

In a preferred embodiment, the comparator 478 generates a pulse in the first correlation peak detector output signal 441 in response to the magnitude of the first correlator output envelope signal exceeding the sum of the magnitude of the peak threshold signal and the magnitude of the first minimum threshold voltage.

Likewise, comparator 480 compares the second correlator output envelope signal and second minimum threshold voltage with the peak threshold signal 437 to generate a second correlation peak detector output signal 445. In a preferred embodiment, comparator 480 incorporates an open collector output circuit which is pulled up to a positive voltage through resistor 486.

In a preferred embodiment, the comparator 480 produces a pulse in the second correlation peak detector output signal 445 in response to the magnitude of the second correlator output envelope signal exceeding the sum of the magnitude of the peak threshold signal and the magnitude of the second minimum threshold voltage.

In a preferred embodiment, the first and second correlation peak detector output signals 441 and 445 are combined in a combiner 490 (which may be an AND gate) resulting in a combined correlation peak detector output signal 455 having a pulse in response to a correlation peak occurring in either correlator output signal. The combined correlation peak detector output signal 455 may be used to establish timing synchronization in a receiver as more fully discussed below with respect to FIG. 6.

Figure 5:
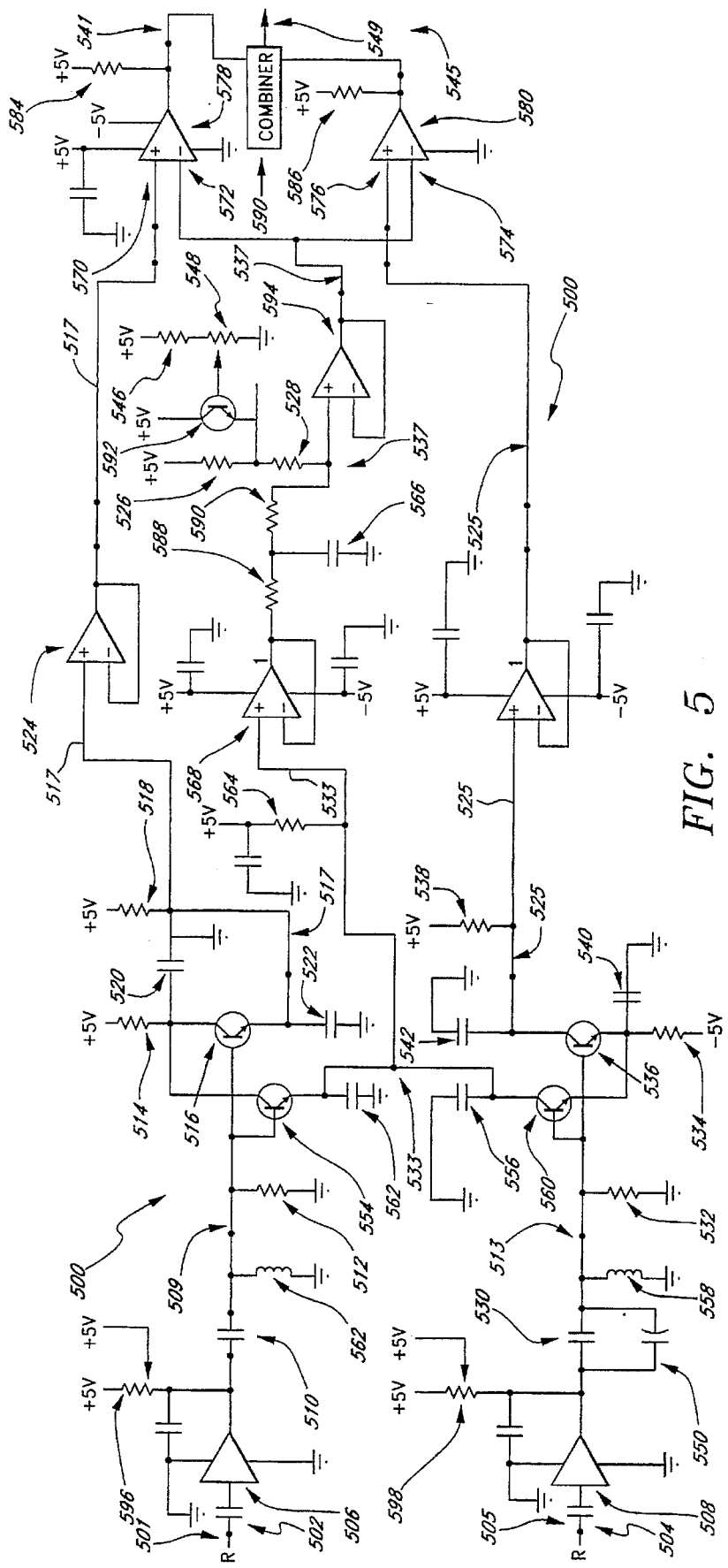
FIG. 5 is a schematic diagram of another embodiment of a correlation peak detector circuit.

FIG. 5 is a schematic circuit diagram of a second preferred embodiment of a correlation peak detector circuit 500 which may be used to detect correlation peaks occurring in either of two correlator output signals according to one or more aspects of the present invention. In the correlation peak detector circuit 500, the envelopes of two correlator output signals are each individually compared to a single peak threshold signal derived from the maximum peak signal level generated by either of the correlator output signals. A combined correlation peak detector output signal indicates whether the magnitude of the envelope of either correlator output signal exceeds the magnitude of the peak threshold level by a preset margin, e.g., by at least the magnitude of a minimum threshold signal.

A first correlator output signal 501 is coupled via a first coupling capacitor 502 to a first high frequency amplifier 506. In a preferred embodiment the high frequency amplifier 506 comprises a monolithic microwave integrated circuit (MMIC) amplifier which may be a Mini-Circuits MAR-6SM. In a preferred embodiment, bias current is provided to high frequency amplifier 506 via potentiometer 596. Potentiometer 596 allows the bias current to be varied so as to precisely adjust the gain of high frequency amplifier 506.

The high frequency amplifier 506 generates a first amplified correlator output signal 509 which is coupled to a first envelope detection circuit comprising resistors 514 and 518; transistor 516; bypass capacitor 520; and rectification capacitor 522. The values of resistor 518 and capacitor 522 are selected to provide an appropriate RC decay time constant for following the envelope of the first amplified correlator output signal 509.

In a preferred embodiment, the first amplified correlator output signal 509 is coupled to the first envelope detection circuit by coupling capacitor 510, inductor 562, and resistor 512. These elements are selected to provide a proper RF loading on high frequency amplifier 506.

The first envelope detection circuit provides a first correlator output envelope signal 517 via a buffer amplifier 524 to a positive input 570 of a first comparator 578.

Likewise, a second correlator output signal 505 is coupled via a second coupling capacitor 504 to a second high frequency amplifier 508. In a preferred embodiment the high frequency amplifier 508 comprises a monolithic microwave integrated circuit (MMIC) amplifier which may be a Mini-Circuits MAR-6SM. In a preferred embodiment, bias current is provided to high frequency amplifier 508 via potentiometer 598. Potentiometer 598 allows the bias current to be varied so as to precisely adjust the gain of high frequency amplifier 508. In a preferred embodiment, potentiometers 596 and 598 are adjusted to equalize the gains of high frequency amplifiers 506 and 508.

The high frequency amplifier 508 provides a second amplified correlator output signal 513 which is coupled to a second envelope detection circuit comprising resistors 534 and 538; transistor 536; bypass capacitor 540; and rectification capacitor 542. The values of resistor 538 and capacitor 542 are selected to provide an appropriate RC decay time constant for following the envelope of the second amplified correlator output signal 513.

In a preferred embodiment, the second amplified correlator output signal 513 is coupled to the second envelope detection circuit by coupling capacitors 530 and 550, inductor 558, and resistor 532. These elements are selected to provide a proper RF loading and tuning on high frequency amplifier 508 to match and balance amplified correlator output signals 509 and 513.

The second envelope detection circuit provides a second correlator output envelope signal 525 via a buffer amplifier 544 to a positive input 576 of a second comparator 580.

The high frequency amplifiers 506 and 508 also provide first and second amplified correlator output signals 509 and 513 to a peak-holder comprising transistors 554 and 560, peak-hold capacitors 556 and 562, and resistor 564. The peak-holder detects the peak signal level generated by the first and/or second correlator output signals and generates a peak detection signal 533. The values of peak-hold capacitors 556 and 562 and resistor 564 are selected to provide a sufficiently long RC decay time constant such that the voltage on capacitors 556 and 662 decays only slightly within a symbol period T.

In a preferred embodiment, peak threshold signal 533 is provided via buffer amplifier 568 to a minimum threshold generator and peak scaler comprising transistor 592, resistors 590, 528, 526, and 546, and potentiometer 548. The buffer amplifier 568 couples its output to the minimum threshold generator and peak scaler through a low pass filter comprising resistor 588 and capacitor 566 which removes any residual high frequency signal passed by the peak-holder. The minimum threshold generator and peak scaler scales the peak threshold signal 533, and couples a minimum threshold voltage resulting in a combined peak threshold and minimum threshold signal 537. Scaling is performed by voltage division from resistors 528, 588 and 590. In a preferred embodiment, the minimum threshold voltage may be adjusted by means of potentiometer 548. The peak threshold and minimum threshold signal 537 is coupled through buffer amplifier 594 to comparators 578 and 580.

Comparator 578 compares the first correlator output envelope signal with the peak threshold signal and the minimum threshold voltage to produce a first correlation peak detector output signal 541. In a preferred embodiment, comparator 578 incorporates an open collector output circuit which is pulled up to a positive voltage through resistor 584.

In a preferred embodiment, the comparator 578 generates a pulse in the first correlation peak detector output signal 541 in response to the magnitude of the first correlator output envelope signal exceeding the sum of the magnitude of the peak threshold signal and the magnitude of the minimum threshold voltage.

Likewise, comparator 580 compares the second correlator output envelope signal with the peak threshold signal and the minimum threshold voltage to produce a second correlation peak detector output signal 545. In a preferred embodiment, comparator 580 incorporates an open collector output circuit which is pulled up to a positive voltage through resistor 586.

In a preferred embodiment, the comparator 580 generates a pulse in the second correlation peak detector output signal 545 in response to the magnitude of the second correlator output envelope signal exceeding the sum of the magnitude of the peak threshold signal and the magnitude of the minimum threshold voltage.

In a preferred embodiment, transistors 516, 536, 554 and 560 are selected to be matched transistors exhibiting the same characteristics. Also, transistor 592 is selected to match transistors 516, 536, 554 and 560 for temperature compensation.

In a preferred embodiment, the first and second correlation peak detector output signals 541 and 545 are combined in a combiner 590 (which may be an AND gate) resulting in a combined correlation peak detector output signal 549 having a pulse in response to a correlation peak occurring in either correlator output signal 501, 505. The combined correlation peak detector output signal 549 may be used to establish timing synchronization as more fully discussed below with respect to FIG. 6.

In a preferred embodiment, a correlation peak detector according to the present invention is used in a receiver in a mobile radio communication system comprising one or more mobile user stations or handsets and one or more fixed base stations.

In a preferred embodiment, a correlation peak detector according to the present invention is used in a receiver in a mobile radio communication system employing spread spectrum techniques and time division duplexing (TDD). Preferably, the communication system employs a communication protocol wherein a base station communicates with a plurality of user stations over a plurality of time slots in a polling loop as described in copending U.S. application Ser. No. 08/284,053 filed on Aug. 1, 1994 and entitled "P C S POCKET PHONE/MICROCELL COMMUNICATION OVER-AIR PROTOCOL," which is hereby fully incorporated by reference as if fully set forth herein.

In a spread spectrum communication system employing TDD or TDMA, each received transmission within a time slot may comprise a plurality of fixed pulse, followed by a plurality of pulse position modulated (PPM) pulses. The fixed pulses are not pulse position modulated. Each fixed pulse appears at a predetermined fixed time within each time slot. The pulse position modulated pulses appear in a series of PPM timing frames following the fixed pulses.

In a preferred embodiment, each of the plurality of pulse position modulated pulses appear within one of M pulse position windows within each PPM timing frame. Detection of a PPM pulse within a particular pulse position window may correspond to one or more data bits to be communicated. In such a case, a pulse position modulation detector may require precise timing to set the beginning and end of each pulse position window and thereby to determine in which PPM window a received pulse occurred. By determining the precise timing when the fixed pulses are received in a particular time slot, a receiver may synchronize its operation with the received signal to accurately set timing for each of the subsequent PPM timing frames within the time slot.

Figure 6:
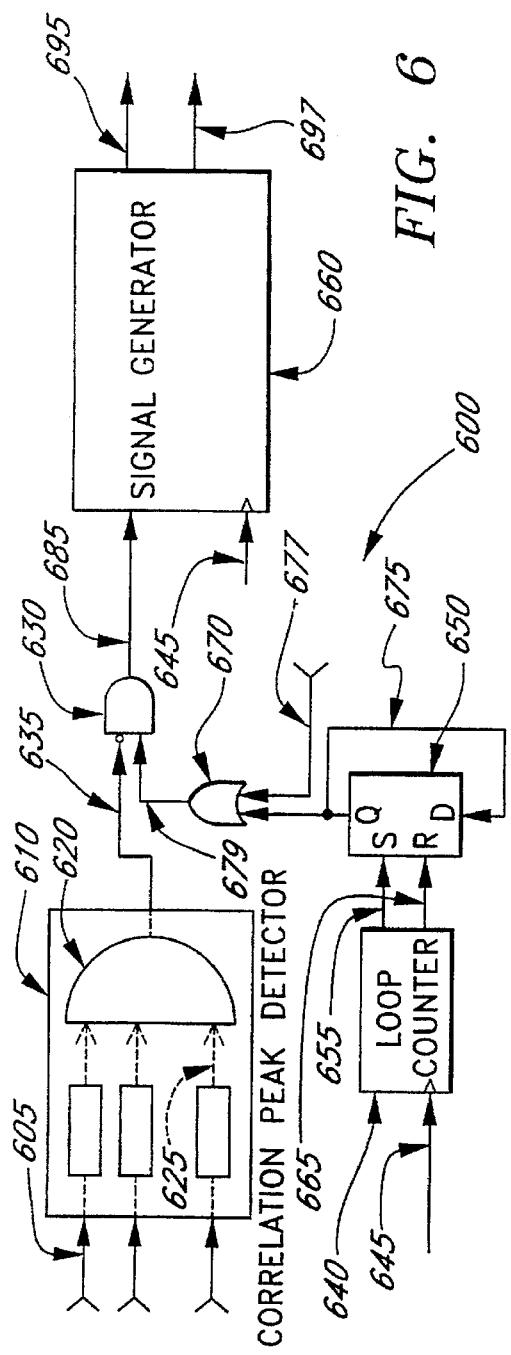
FIG. 6 is a block diagram of a timing generator for a receiver incorporating a correlation peak detector.

A preferred embodiment of a timing generator 600 in accordance with one or more aspects of the present invention is shown in FIG. 6. A correlation peak detector 610 receives one or more correlator output signals 605. In a preferred embodiment, the correlation peak detector 610 comprises the correlation peak detector circuit 500. In the correlation peak detector 610, one or more correlation peak detector output signals 625, each having a pulse in response to detection of an apparent correlation peak in one correlator output signal 605, are generated. The correlation peak detector output signals 625 are functionally "OR-ed" together to produce a combined correlation peak detector output signal 635 having a pulse in response to an apparent correlation peak in any of the correlator output signals 605.

Figure 7:
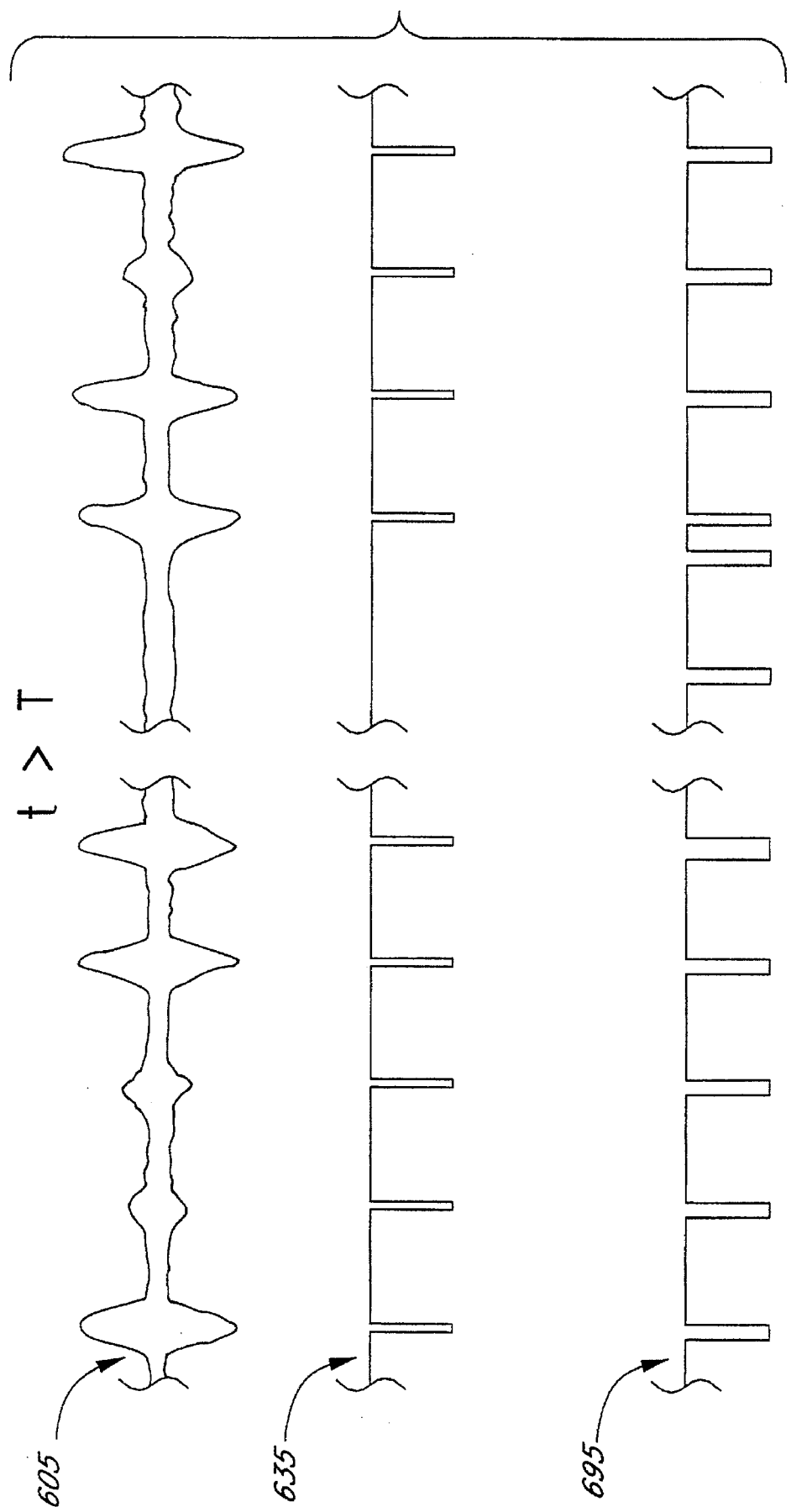
FIG. 7 is a graph of various signals associated with the timing generator of FIG. 6.

In a preferred embodiment, the correlation peak detector output signals 625 each produce low-going pulses. In that case, the "OR" function may be realized by an AND gate 620 as shown in FIG. 6. Thus the combined correlation peak detector output signal 635 exhibits a low-going pulse in response to detection of an apparent correlation peak as shown in the timing diagram of FIG. 7. As the correlator output signal decreases from its peak value, the combined correlation peak detector output signal 635 returns high and remains high until a next apparent correlation peak occurs.

Alternatively, a communication protocol may provide that the fixed pulses are always provided by a predetermined correlator tap signal 605. In that case, it is not necessary to combine correlator peak detector output signals.

The timing generator also includes a programmable loop counter 640 which receives a clock signal 645 which continuously counts clock cycles over a period W.

In a preferred embodiment, W corresponds to a polling loop, or major frame, in a time division duplexed (TDD) communication system. The major frame comprises a plurality of time slots or minor frames each of which may be assigned to a particular receiver. Each time slot may be further divided into a plurality of chip intervals.

In response to the clock signal 645, the programmable loop counter 640 counts chip intervals during each polling loop to determine a timing window, having duration ΔT, wherein a next fixed pulse is expected to be received. The programmable loop counter 640 defines the beginning of each timing Window by generating a high-going pulse in a window start signal 655. The programmable loop counter 640 defines the end of each timing window by generating a high-going pulse in a window stop signal 665. In a preferred embodiment, each timing window may have a duration of ±4 chip intervals.

The window start signal 655 is coupled to the "set" input of a flip-flop 650. The window stop signal 665 is coupled to the "reset" input of the flip-flop 650. Flip-flop 650 generates a timing window gating signal 675 in response to the window start signal 655 and window stop signal 665. When the window start signal goes high, the timing window gating signal 675 also goes high or active and remains high until it is reset by a high-going pulse in the window stop signal 665.

The timing window gating signal 675 is coupled to an OR gate 670. The OR gate 670 also receives a timing acquisition signal 677, and generates a synchronization gating signal 679.

The combined correlation peak detector output signal 635 is provided to an inverting input of an AND gate 630. The synchronization gating signal 679 is provided to a noninverting input of the AND gate 630. The AND gate 630 generates a gated correlation peak detector output signal 685 which is provided to a reset input of a signal generator 660. The signal generator 660 also receives the clock signal 645, and generates a synchronized timing signal 695 which is synchronized to pulses appearing in the gated correlator output signal 685.

So long as the timing acquisition signal 677 remains low, the synchronization gating signal 679 follows the timing window gating signal 675 such that only those apparent correlation peaks which are detected during a timing window set by the programmable loop counter 640 can produce pulses in the gated correlator output signal 685. Consequently, the signal generator 660 only synchronizes the synchronized timing signal 695 to those apparent correlation peaks which occur during a timing window.

Upon receiving a pulse in the gated correlation peak detector output signal 685, the signal generator 660 synchronizes the synchronized timing signal 695 to the pulse. If a subsequent apparent correlation peak occurs before the end of the timing window, the correlation peak detector 610 generates a subsequent pulse, and the signal generator resynchronizes the synchronized timing signal 695 to the subsequent pulse. If no subsequent apparent correlation peaks occurs before the end of the timing window, then the synchronized timing signal 695 remains synchronized to the last apparent correlation peak. Thus the operation of the signal generator 660 is controlled such that it synchronizes the synchronized timing signal 695 with the detection of correlation events by the correlation peak detector.

In a preferred embodiment, the signal generator 660 also detects the absence of a pulse in the gated correlation peak detector output signal 685 within a timing window. The signal generator 660 generates a timing verification signal 697 which indicates a failure to receive a pulse during a timing window. The timing verification signal 697 may be provided to a microprocessor or to timing circuits within the receiver to indicate a loss of timing. When timing is lost, the timing acquisition signal 677 is made to go high to override the timing windows and thereby to cause the signal generator 660 to resynchronize the synchronized timing signal 695 to a pulse produced by the correlation peak detector 610 which occurs outside of an expected timing window.

The synchronized timing signal 695 may be provided to other circuits in the receiver to synchronize their operation with the received signal. For example, a timing window may be opened in symbol detection circuitry within the receiver corresponding with the time when a next correlation event should be expected. Thus, false triggering on noise is inhibited. The synchronized timing signal 695 may also provide timing synchronization for the programmable loop counter 640.

In a preferred embodiment, the timing signal 695 provides precise timing for determining the beginning and end of each pulse position window within a PPM timing frame.

Figure 8:
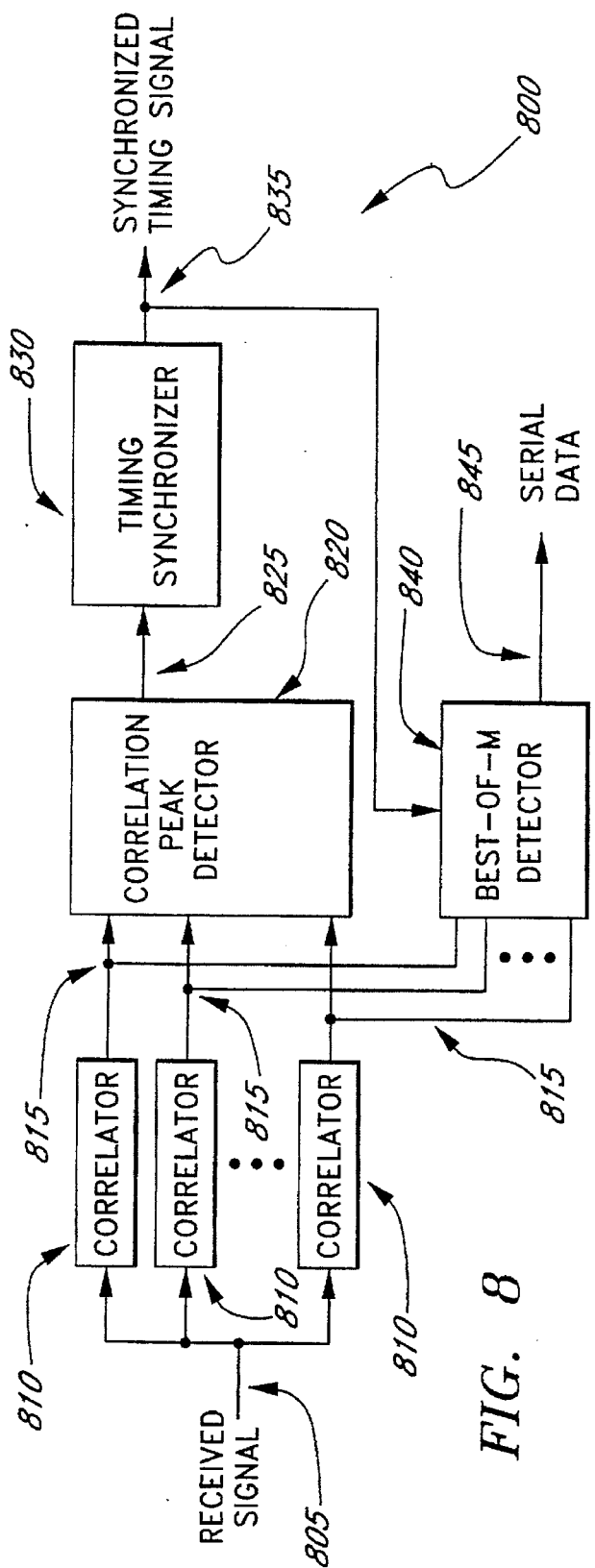
FIG. 8 is a block diagram of a preferred spread spectrum receiver used in conjunction with a correlation peak detector according to one or more aspects of the present invention.

FIG. 8 is a block diagram of a preferred spread spectrum receiver 800 incorporating a correlation peak detector 810 according to one or more aspects of the present invention.

In the spread spectrum receiver 800, a received spread spectrum signal 805 is coupled to one or more (M) correlators 810. The received spread spectrum signal 805 comprises one or more symbols transmitted using one or more (M) spreading code sequences. Each of the (M) correlators 810 compares the received spread spectrum signal 805 with a unique despreading code sequence matched to one spreading code sequence used to generate the received spread spectrum signal 805.

Each correlator 810 provides a correlator output signal 815. In a preferred embodiment, each correlator output signal 815 exhibits a correlation peak in response to a correlation event. Each correlator output signal 815 is coupled to a correlation peak detector 820 and also, in a preferred embodiment, to a Best-of-M detector 840.

In a preferred embodiment, correlation peak detector 820 may comprise correlation peak detector 400 or correlation peak detector 500 as described elsewhere herein.

Correlation peak detector 820 provides a combined correlation peak detector output signal 825 to a timing synchronizer 830. The timing synchronizer 830 generates a synchronized timing signal 835 in response to correlation events occurring in the received signal 805. The timing synchronizer 830 may comprise a programmable loop counter and a signal generator as described elsewhere herein. The timing synchronizer 830 provides the synchronized timing signal 835 to the Best-of-M detector 840.

The Best-of-M detector produces a serial data signal 845 in response to correlation peaks detected in each of the correlator output signals 815. The Best-of-M detector 840 may include a control logic circuit which receives the synchronized timing signal 835 and produces therefrom internal timing signals for the Best-of-M detector.

In a preferred embodiment, the Best-of-M detector 840 comprises a pulse position modulation detector for detecting correlation peaks in a timing frame divided into plurality of pulse position windows. For example, during each timing frame, the Best-Of-M detector may compare peak levels for each correlator output signal 815 in each pulse position window to select which pulse position window and which correlator output signal produce the highest peak. For each timing frame, the Best-of-M detector selects a data symbol corresponding to the pulse position window and correlator output which produce the highest peak. From the selected data symbols, the Best-of-M detector produces a serial data stream. In such a case, the synchronized timing signal 835 may be used to generate clocks for the timing frames and pulse position windows.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A method of detecting a correlation peak in a correlator output signal, comprising the steps of:

detecting an envelope of the correlator output signal to produce a correlator output envelope signal;

detecting and holding a peak of the correlator output signal to produce a peak detection signal;

scaling the peak detection signal to produce a peak threshold signal;

comparing the magnitude of the correlator output envelope signal with the magnitude of the peak threshold signal to produce a correlation peak detector output signal said step of comparing the magnitude of the correlator output envelope signal with the magnitude of the peak threshold signal including the step of determining whether the magnitude of the correlator output envelope signal exceeds the sum of the magnitude of the peak threshold signal and the magnitude of a minimum threshold signal.

2. An apparatus for detecting correlation peaks in a correlator output signal, comprising:

an envelope detector receiving the correlator output signal and outputting a correlator output envelope signal;

a peak-holder receiving said correlator output signal and outputting a peak detection signal;

a peak scaler coupled to said peak detection signal, and outputting a peak threshold signal;

a comparator coupled to said correlator output envelope signal and said peak threshold signal;

a minimum threshold generator outputting a threshold signal; and, a combiner combining said minimum threshold signal with said peak threshold signal and coupling said combined minimum threshold signal and peak threshold signal to said comparator.

3. An apparatus for detecting correlation peaks in a correlator output signal, comprising:

an envelope detector receiving the correlator output signal and outputting a correlator output envelope signal;

a peak-holder receiving said correlator output signal and outputting a peak detection signal;

a peak scaler coupled to said peak detection signal, and outputting a peak threshold signal;

a comparator coupled to said correlator output envelope signal and said peak threshold signal;

a threshold generator outputting a threshold signal; and, a combiner combining said threshold signal with said correlator output envelope signal and coupling said combined threshold signal and correlator output envelope signal to said comparator.

4. The apparatus of claim 2, wherein said comparator generates a pulse in the correlation peak detector output signal response to the magnitude of the correlator output envelope signal exceeding the sum of the peak threshold signal and the minimum threshold signal.

5. The apparatus of claim 4 wherein said apparatus is coupled to a signal generator, said signal generator generating a timing signal synchronized to a pulse in said correlation peak detector output signal.

6. A correlation peak detector for detecting peaks in a plurality of correlator output signals, comprising:

a plurality of envelope detectors, each of said envelope detectors connected to a one of said plurality of correlator output signals and each outputting a correlator output envelope signal;

a peak-holder connected to each of said plurality of correlator output signals and outputting a peak detection signal;

a peak scaler coupled to said peak detection signal and outputting a peak threshold signal; and a plurality of comparators, each of said comparators connected to a one of said correlator output envelope signals and said peak threshold signal and outputting a correlation peak detector output signal.

7. The correlation peak detector of claim 6, further comprising:

a minimum threshold generator for generating a minimum threshold signal;

a combiner combining said minimum threshold signal with said peak threshold signal and coupling said combined minimum threshold signal and peak threshold signal to each of said plurality of comparators.

8. The correlation peak detector of claim 7, further comprising a second combiner connected to each of said correlation peak detector output signals and outputting a combined correlation peak detector output signal.

9. The correlation peak detector of claim 8 wherein said combined correlation peak detector output signal is coupled to a signal generator, said signal generator generating a timing signal synchronized to a pulse in said correlation peak detector output signal.

* * * * *